United States Patent
Carpenter et al.

(10) Patent No.: US 7,668,037 B2
(45) Date of Patent: Feb. 23, 2010

(54) STORAGE ARRAY INCLUDING A LOCAL CLOCK BUFFER WITH PROGRAMMABLE TIMING

(75) Inventors: Gary D. Carpenter, Austin, TX (US); Fadi H. Gebara, Austin, TX (US); Jerry C. Kao, Ann Arbor, MI (US); Jente B Kuang, Austin, TX (US); Kevin J. Nowka, Georgetown, TX (US); Liang-Teck Pang, Albany, CA (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 11/935,566

(22) Filed: Nov. 6, 2007

(65) Prior Publication Data

US 2009/0116312 A1    May 7, 2009

(51) Int. Cl.
*G11C 8/00* (2006.01)
(52) U.S. Cl. .............. 365/233.1; 365/230.06; 365/185.25; 365/203; 365/194
(58) Field of Classification Search .............. 365/233.1, 365/230.06, 185.25, 203, 194
See application file for complete search history.

(56) References Cited

U.S. PATENT DOCUMENTS

| | | | |
|---|---|---|---|
| 4,769,791 A | 9/1988 | Liou et al. | |
| 5,122,978 A | 6/1992 | Merrill | |
| 6,252,820 B1 | 6/2001 | Nakamura | |
| 6,414,535 B1 | 7/2002 | Ooishi | |
| 6,549,452 B1 | 4/2003 | Park | |
| 6,891,772 B2 * | 5/2005 | Demone | 365/230.04 |
| 2002/0152434 A1 | 10/2002 | Dawson et al. | |
| 2004/0105339 A1 | 6/2004 | Iwahashi et al. | |
| 2005/0204211 A1 | 9/2005 | Gouin et al. | |

OTHER PUBLICATIONS

U.S. Appl. No. 11/840,481, filed Aug. 17, 2007, Cases, et al.
U.S. Appl. No. 11/840,498, filed Aug. 17, 2007, Cases, et al.

(Continued)

*Primary Examiner*—Hoai V Ho
*Assistant Examiner*—Jason Lappas
(74) *Attorney, Agent, or Firm*—Mitch Harris, Atty at Law, LLC; Andrew M. Harris; Libby Z. Handelsman

(57) ABSTRACT

A storage array including a local clock buffer with programmable timing provides a mechanism for evaluating circuit timing internal to the storage array. The local clock buffer can independently adjust the pulse width of a local clock that controls the wordline and local bitline precharge pulses and the pulse width of a delayed clock that controls the global bitline precharge, evaluate and read data latching. The delay between the local clock and the delayed clock can also be adjusted. By varying the pulse widths of the local and delayed clock signal, along with the inter-clock delay, the timing margins of each cell in the array can be evaluated by reading and writing the cell with varying pulse width and clock delay. The resulting evaluation can be used to evaluate timing margin variation within a die, as well variation from die-to-die and under varying environments, e.g., voltage and temperature variation.

25 Claims, 7 Drawing Sheets

OTHER PUBLICATIONS

U.S. Appl. No. 11/250,061, filed Oct. 13, 2005, Kuang, et al.
U.S. Appl. No. 11/609,598, filed Dec. 12, 2006, Ehrenreich, et al.
U.S. Appl. No. 11/682,542, filed Mar. 6, 2007, Carpenter, et al.
U.S. Appl. No. 11/781,994, filed Jul. 24, 2007, Kuang, et al.

* cited by examiner

STORAGE ARRAY INCLUDING A LOCAL CLOCK BUFFER WITH PROGRAMMABLE TIMING

BACKGROUND OF THE INVENTION

1. Technical Field

The present invention relates generally to memory circuits, and more particularly to a storage array with a local clock buffer having adjustable timing for determining internal timing margins of the array.

2. Description of the Related Art

Storage cell performance is a critical limitation in today's processing systems and is predicted to become even more of a critical limitation as technologies move forward. In particular, static random access memory (SRAM) cells are used in processor caches and external storage to provide fast access to data and program instructions. Static storage cells are also used within processors and other digital circuits for storing values internally, for example, in processor registers. With processor cycle frequencies reaching well above 4 Ghz, development of SRAM cells that can store and provide access to stored values within that period has become necessary. However, as the storage cell access times decrease, determining the internal timing margins of various portions of both read and write access cycles presents a challenge. If a probe is used to attempt to measure the internal timing of a read or write operation, the probe alters the timing of the cell, yielding incorrect results.

As storage cell access times decrease, the validity of circuit simulations also decreases, therefore, while simulations are valuable, measurements performed on actual storage devices in their fully-implemented condition, e.g., the entire storage array and access circuits, is a necessity. Timing margins are direct indicators of potential performance of a storage array design, as the timing margins dictate the relationship between potentially specified or required performance and production yields of components including the storage array design. Further, variation in timing margins from die-to-die and within a die reveal information about process variations and particular failure mechanisms.

Various techniques such as one-shot delay lines and ring oscillators have been used to obtain data on portions of the internal timing of storage cells. However, a complete model of timing margins based on measurements made by such circuits must generally include summing measurements from multiple test circuits that include the individual timing portion measurement capability in order to obtain the overall timing margin. Including all of the delay and/or ring oscillator test circuits required to implement a complete timing margin may consume significant circuit area and may also require modification of the layout of the device incorporating the test circuits. Further, there is generally a probing requirement associated with such measurement, requiring test pads than may not be practical in production circuits, or that would require significant disruption of the layout in order to provide the test pads. Finally, such techniques typically do not measure the performance of an individual storage cell, due to the aggregation of storage cell performance in ring oscillator and delay line circuits. It is desirable to measure the performance of each cell in an array due to variation in device characteristics across the array and due to worst-case signal timing conditions at various positions within the array.

It is therefore desirable to provide a test circuit and method for accurately determining the internal timing margins of storage cells, including individual cells, under the operating conditions of an actual storage array. It is further desirable to provide such a test circuit that requires only a small circuit area to implement, so that the test circuit may easily be incorporated in a production storage array and does not significantly perturb the array and access circuitry design.

SUMMARY OF THE INVENTION

The objective of accurately determining internal timing margins within a storage array, including timing margins of individual storage cells, is accomplished in a storage array including a local clock buffer circuit requiring only small additional circuit area for implementation. The local clock buffer circuit can be integrated within test and/or production storage arrays. The storage array can also be used as a general-purpose storage array with adjustable timing.

The circuit provides for programmable or otherwise externally stimulated adjustment of delay times and pulse widths for local wordline, global bitline and local/global pre-charge timing. Digital values are loaded into latches that control either an analog bias or a selection circuit that adjusts the delay between local wordline signals and global bitline read circuit enable, as well as the pulse width of the wordline and read enable signals. Alternatively, analog voltages can be introduced via test points/terminals to control delay devices. A pulse width measurement circuit can be included within the storage array to capture the actual delays and pulse widths set by the delay and pulse width control.

The pulse widths of the wordline and global bitline read enable signals and the wordline to global bitline read enable signal delay are varied and measured, to determine their operational ranges for particular storage arrays and the storage array operating conditions, e.g., temperature and power supply voltage. The timing margins are extracted by determining the point of failure for each of the pulse widths and the wordline to global bitline read enable signal delay in order to determine the signal timing margins for the storage array.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a storage array circuit for evaluating timing margins for accessing storage cells, e.g., registers or static memory cells, in order to facilitate design improvement and determination of operating and margins. The storage array can also be used as a general-purpose array with adjustable timing. Programmable delays are provided in the local clock buffer that times access to the cells by controlling the wordline assertion timing and pulse width and the global bitline evaluate timing and pulse width. The circuit loading and structure of the cells, bitlines and read sense circuits/write circuits is identical to that in a production storage array, providing an accurate measure timing margins in a production array implementation and the circuit of the present invention may be incorporated either temporarily or permanently within production storage arrays.

Figure 1:
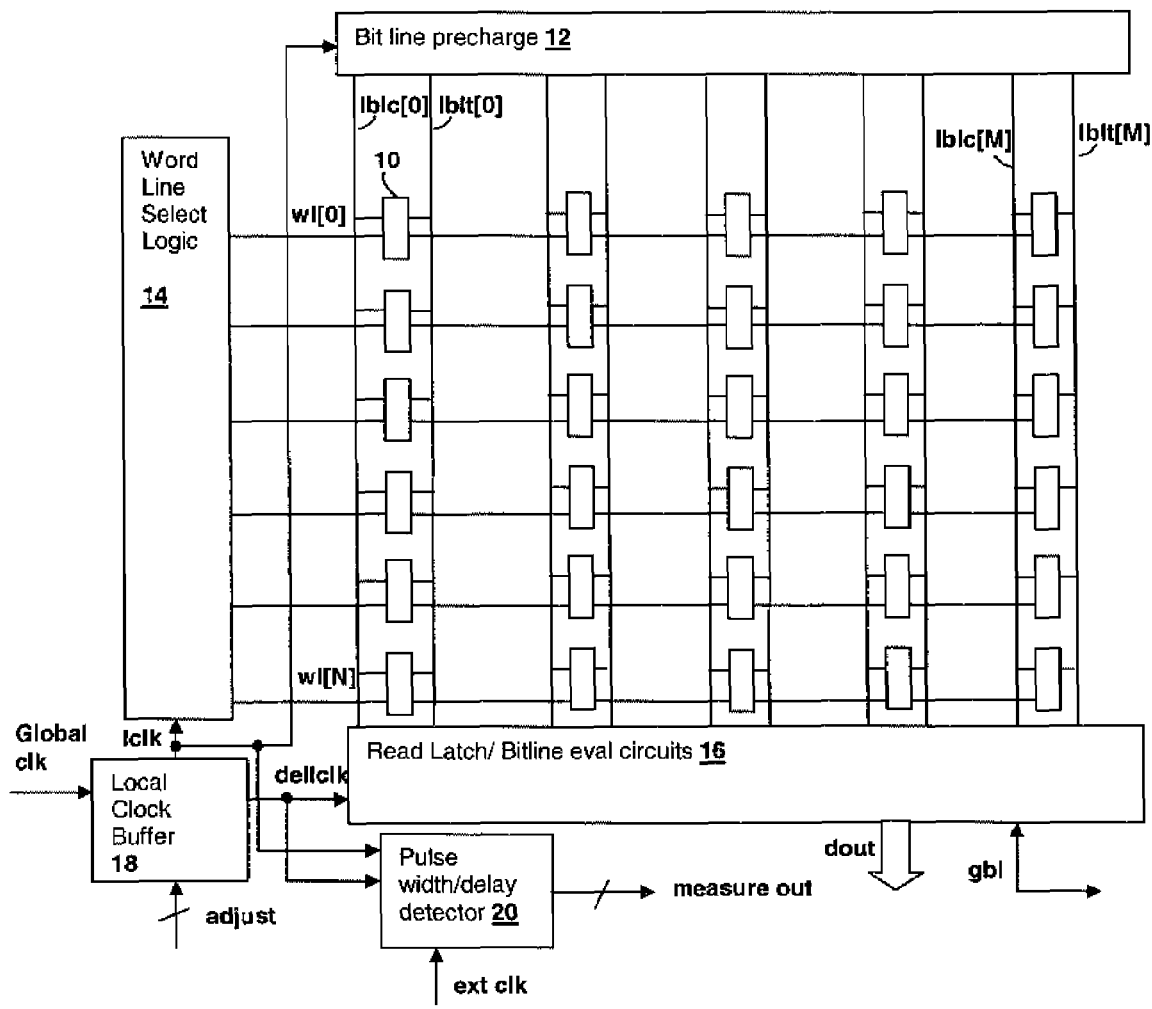
FIG. 1 is a block diagram of a storage array circuit in accordance with an embodiment of the invention.

With reference now to the figures, and in particular with reference to FIG. 1, a block diagram of a storage sub-array circuit in accordance with an embodiment of the invention is shown. An sub-array of storage cells 10, forming rows and columns are connected to read/write access circuitry. The read/write access circuitry include a word line select logic 14, which activates cells 10 in a row according to word line control signals wl[0:N], and a read latch/bit-line evaluation circuits 16 that gate sub-array local bitlines lblt[0:M],lblt[0:M] to evaluate the resultant values on global bitlines gbl and latch the resultant values. A bit-line pre-charge circuit 12 pre-charges local bitlines lblt[0:M], lblt[0:M] in preparation for a storage cell 10 read access, and also sets their values according to input values provided from write logic during storage cell 10 write accesses.

A local clock buffer 18 provides local control signals, including a local clock signal lclk and delayed clock signal dellclk, which are derived from a global clock signal Global clk. Local clock signal lclk controls the timing of wordline control signals wl[0:N] via wordline select logic 14, which activate pass devices within storage cells 10 to couple their internal storage elements to local bitlines lblt[0:M],lblt[0:M] in order to perform a read or write operation. Local clock signal lclk also controls the local bitline lblt[0:M],lblt[0:M] write set-up and pre-charge timing, which is generally generated as a complementary time period with respect to the wordline timing. Delayed clock signal dellclk controls the timing of the evaluation of the values imposed on local bitlines lblt[0:M], lblt[0:M] by storage cells 10 during a read operation, as well as the timing of latching of the result of the evaluation.

In the present invention, local clock buffer 18 has programmable timing provided by one or more adjust signals, which are analog or digital control signals that independently set one or more of the pulse widths of local clock signal lclk and delayed clock signal dellclk, and the delay time between the leading edges of local clock signal lclk and delayed clock signal dellclk. The storage array circuit of FIG. 1 also includes a pulse width/delay detector circuit 20 so that delay and pulse width values programmed via the adjust signals can be measured with reference to an external clock signal ext clk, so that stable and repeatable measurements of the exact delay and pulse widths set by the adjust signals can be determined when evaluating timing margins of the array. A set of digital signals measure out provide for scannable access to an indication of the pulse widths and delay times measured by pulse width/delay detector circuit 20.

While the illustrative embodiment depicted in FIG. 1 is specifically directed to a static storage array having dynamic logic evaluation circuits and local/global bitline partitioning, it is understood that the techniques of the present invention apply to other types of storage arrays in which timing margins can be evaluated by adjusting the pulse width(s) and relative timing of control signals internal to the array. The methods and circuit techniques described herein are applicable to storage arrays such as that shown in FIG. 1 as well as other types of storage arrays and dynamic logic circuits in general.

Figure 2:
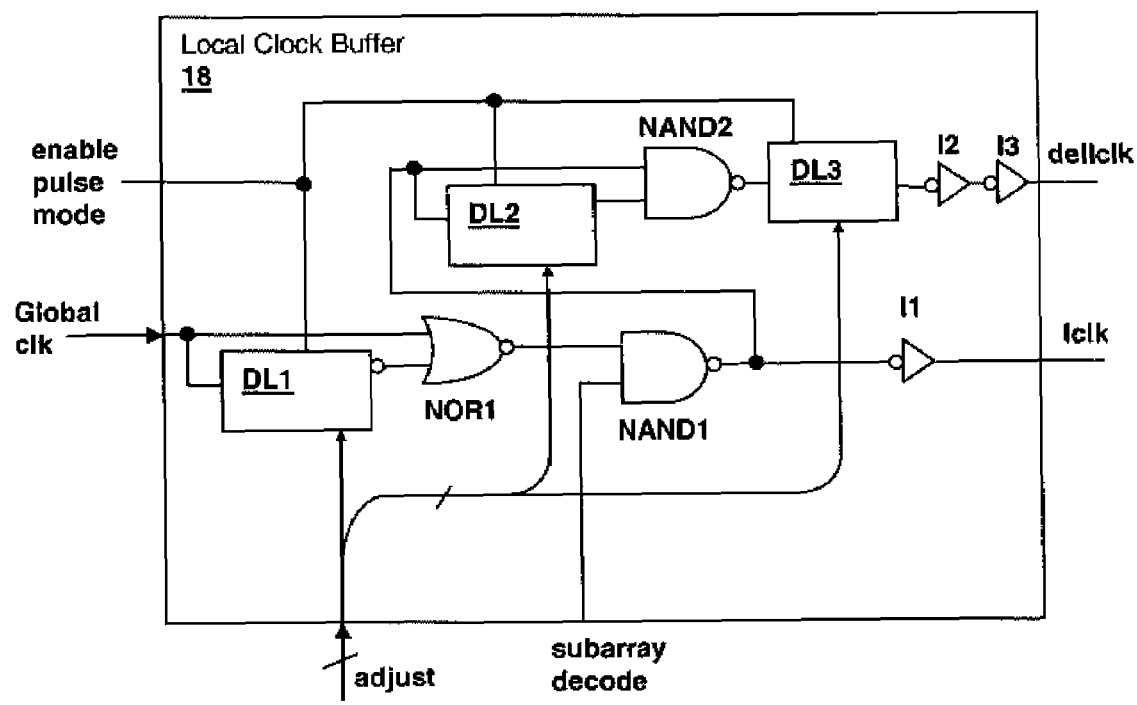
FIG. 2 is a simplified schematic diagram showing details of local clock buffer 18 of FIG. 1 in accordance with an embodiment of the invention.

Referring now to FIG. 2, details of local clock buffer 18 in accordance with an embodiment of the present invention are shown. An enable pulse mode signal activates delay lines DL1-DL3, which provide the programmable/adjustable control signal timing of the present invention. When signal enable pulse mode is de-asserted, the timing of the circuit is defaulted to the fastest timing available, and is therefore suitable for operating the sub-array depicted in FIG. 1 in a production array mode. When signal enable pulse mode is asserted, the timing of local clock signal lclk and delayed clock signal dellclk can be adjusted via the adjust signals. Delay circuit DL1 delays global clock signal gclk as applied to one input of logical-NOR gate NOR1. The other input of logical-NOR gate NOR1 is connected directly to global clock signal gclk, so that delay circuit DL1 delays the trailing edge of global clock signal gclk with respect to an active-low pulse signal provided at the output of logical-NOR gate NOR1, thus stretching the width of the pulse according to the delay time length provided by delay circuit DL1. A logical-NAND gate NAND1 qualifies the active-low pulse with a subbarray decode signal to generate another active-low pulse at the output of logical-NAND gate NAND1 that is inverted by inverter I1 to generate local clock signal lclk. The output of logical-NAND gate NAND1 is also provided directly at a first input of logical-NAND gate NAND2, along with a delayed version at a second input of logical-NAND gate NAND2 with a delay determined by a delay time of a delay circuit DL2. The active-low pulse output of logical-NAND gate NAND1 produces an active-high pulse at the output of logical-NAND gate NAND2, with a trailing edge adjusted by the delay time of delay circuit DL2. A delay circuit DL3 adjusts the overall delay of the delayed clock signal dellclk, which is buffered by inverters I2-I3 from the output of delay circuit DL3.

Figure 3:
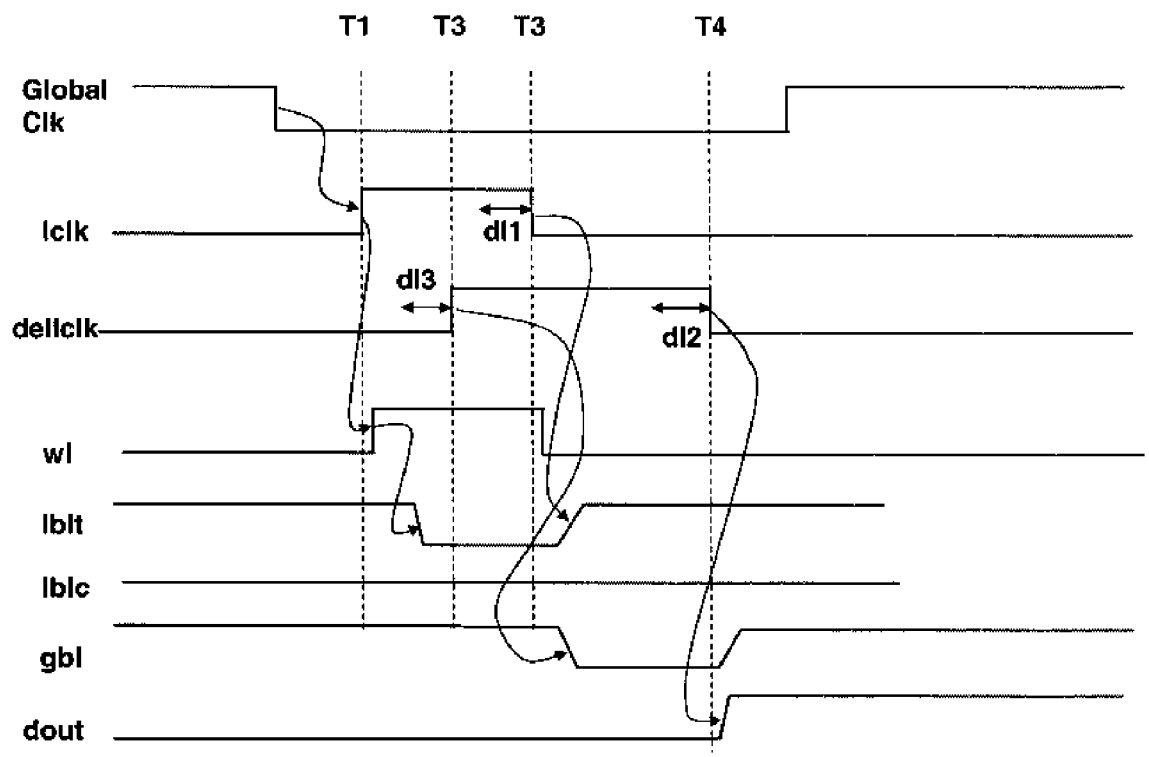
FIG. 3 is a signal timing diagram showing waveforms within the circuit of FIG. 1 and FIG. 2.

Referring now to FIG. 3, signal timing within the circuits of FIG. 1 and FIG. 2 is illustrated with respect to a storage cell read cycle. Prior to the assertion of global clock signal Global clk, local bitlines lblt[0:M],lblt[0:M] are in their pre-charged state. When global clock signal Global clk is asserted (active-low), causing local clock signal lclk to assert (active-high) at time T1, activating a wordline signal wl, which activates pass gates within selected storage cells 10. Local bitlines lblt[0:M],lblt[0:M] then evaluate (illustrated by a falling signal lblt). At time T2, which is adjustable via delay time dl3 provided by delay circuit DL3 of FIG. 2, delayed clock signal dellclk is asserted (active high), which gates the local bitlines lblt[0:M],lblt[0:M] onto evaluate circuits within read latch/ bitline evaluation circuits 16 of FIG. 1. As a consequence, global bitline gbl evaluates (low). At time T3, which is adjustable via delay time dl1 provided by delay circuit DL1 of FIG. 2, local clock signal lclk is de-asserted, causing local bitlines lblt[0:M], lblt[0:M] to return to their pre-charge states by activation of bitline pre-charge circuit 12 of FIG. 1 by the trailing edge of local clock signal lclk. Finally, at time T4 the trailing edge of delayed clock signal dellclk, adjustable via delay time dl2 provided by delay circuit DL2 of FIG. 2, causes read latches within read latch/bitline evaluation circuits 16 of FIG. 1 to capture the values read from storage cells 10 of FIG. 1 to yield data signals dout.

Thus, in the illustration given above, local clock buffer 18 provides adjustment of all of the critical timing events generated by the control signals for the storage array. The minimum local bitline access time can be determined by reducing the width of local clock signal lclk by reducing delay time dl1 and/or increasing delay time dl3 until errors appear in the dout values due to improper setup of local bitlines lblt[0:M],lblt[0:M] into the evaluate circuits within read latch/bitline evaluation circuits 16 of FIG. 1. Similarly, the minimum evaluate/read latch set-up time can be determined by decreasing delay time dl2 until errors appear. A study of worst-case timing at particular locations in the storage array and also random timing variation across the array can be made by determining timing margins at particular storage cells 10 or for each storage cell 10 in the array. Write cycle timing margins can also be determined by the invention, as adjustment of delay time dl1 provides for adjustment of the minimum width of wordline signal wl, which controls the writing of values from local bitlines lblt[0:M],lblt[0:M] into storage cells 10.

Figure 4A:
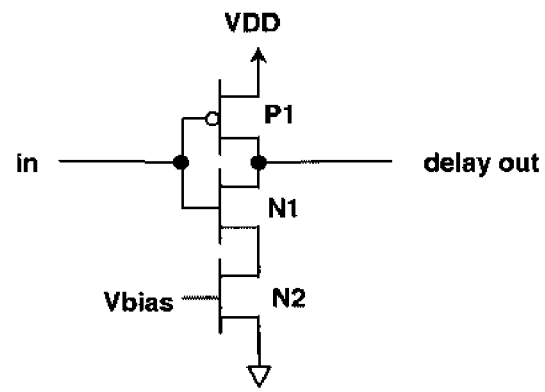
FIG. 4A is a schematic diagram of a delay circuit as may be used to implement delay circuits DL1-DL3 of FIG. 2 in accordance with an embodiment of the invention.

Referring now to FIG. 4A, a delay element that may be used to implement delay circuits DL1-DL3 of FIG. 2 is shown. Transistors N1 and P1 form an inverter having a current level set by a transistor N2, which has a bias level set by a bias voltage Vbias. Reducing bias voltage Vbias "starves" the inverter formed by transistors N1 and P1, increasing the switching time and thereby increasing the delay of the circuit. Bias voltage Vbias may be provided from a test point of the die on which the storage array circuit of FIG. 1 is integrated (including a test point for each bias voltage supplied to delay circuits DL1-DL3 of FIG. 2), or the bias voltage may be locally generated from digital control values. Therefore, the adjust signal(s) shown in FIG. 1 and FIG. 2 may be analog signal(s) supplying one or more bias voltage(s) Vbias to each of delay circuits DL1-DL3, or adjust signal(s) may be a digital signal provided, for example, from scan latches integrated on the die on which the storage array circuit of FIG. 1 is integrated. It is understood that there are many techniques for providing local analog or digital control signals to a test circuit integrated on a packaged or unpackaged die, and such may be used to control delay circuits DL1-DL3 to perform the timing margin analysis of the present invention.

Figure 4B:
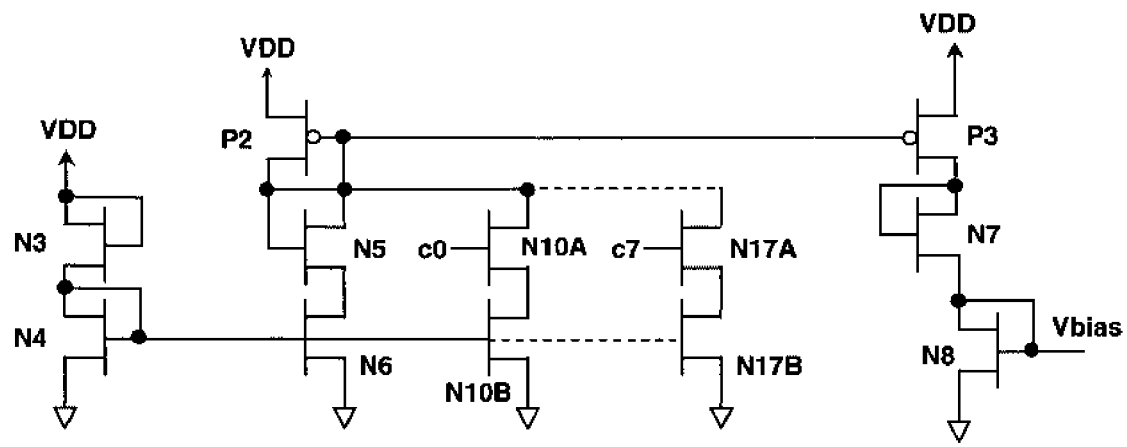
FIG. 4B is a schematic diagram depicting details of a delay control circuit as may be employed in delay circuits DL1-DL3 of FIG. 2 in accordance with an embodiment of the invention.

FIG. 4B shows a bias generating circuit for locally generating bias voltage Vbias from digital control values <c0:c7>, which may be supplied from scan registers or other digital value supplying means as described above. Transistors N3 and N4 supply a bias voltage value to transistor N6 and transistors N10B-N17B, which set a current level drawn through transistor P2, which is mirrored through transistor P3. Transistor N7 provides follower and transistor N8 provides an impedance such that voltage Vbias is set by the current level programmed through transistor P2 by digital control values <c0:c7>. Thus, the combination of the circuits of FIG. 4A and FIG. 4B provide a digitally-controlled delay circuit that can be used to vary the delays of delay circuits DL1-DL3 of FIG. 2 in response to values provided from scan latches or another digital interface.

Figure 5:
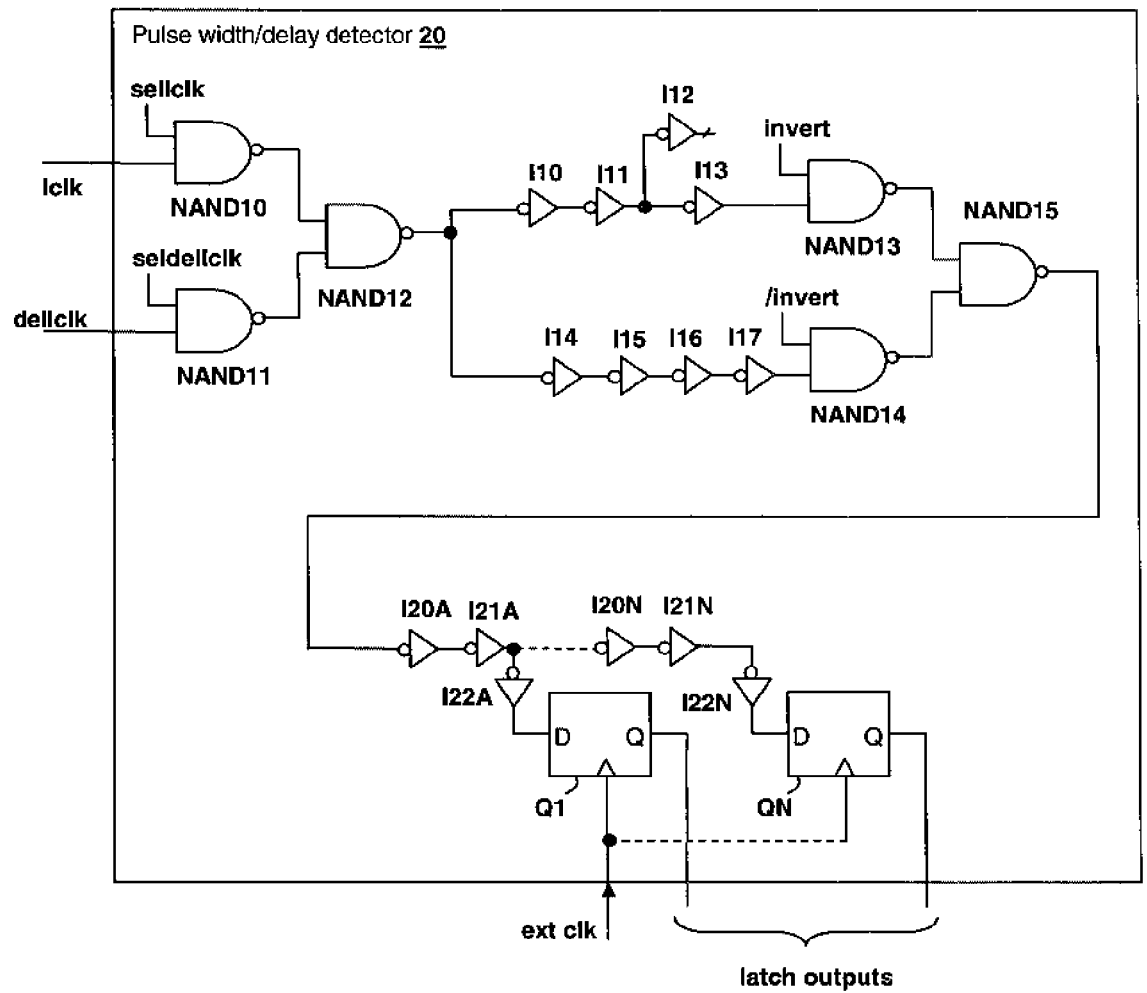
FIG. 5 is a schematic diagram depicting details of pulse width/delay detector 20 of FIG. 1, in accordance with an embodiment of the invention.

Referring now to FIG. 5, details of pulse width/delay detector 20 are shown in accordance with an embodiment of the invention. As mentioned above, it is desirable not only to vary the delays of delay circuits DL1-DL3, but also to have an exact measurement of the delays introduced, as components other than those in delay circuits DL1-DL3 will vary. Also, variation in the delay circuits DL1-DL3 will be present in embodiments such as that of FIG. 4A, as any change in the sizes of transistors P1, and N1-N2 will cause a change in time delay with respect to a particular bias voltage Vbias. Therefore, pulse width/delay detector 20 provides a mechanism for measuring the pulse widths of local clock signal lclk and delayed clock signal dellclk as well as the delay between edges of local clock signal lclk and edges of delayed clock signal dellclk. Logical-NAND gates NAND10-NAND12 form a selector that selects between local clock signal lclk and delayed clock signal dellclk in response to selection signals sellclk and seldellclk, which can be provided via scan latches or another digital interface. The output of logical-NAND gate NAND12 is provided to a pair of inverter chains. The first chain provides an inverted signal path through inverters I10, I11 and I13, with a dummy loading inverter I12 connected to balance the delays between the signal paths and to compensate for the different skew times for rising edge and falling edge due to N-channel versus P-channel device skew. The second inverter chain comprises inverters I14-I7 and provides a non-inverted signal path. Another selector formed by logical-NAND gates NAND13-NAND15 selects between the non-inverted and inverter signal path outputs in response to selection signals invert and /invert, provided from scan latches or other digital input means. Thus, the output of logical-NAND gate NAND15 is selected from either polarity of local clock signal lclk or either polarity of delayed clock signal dellclk.

The delay/pulse width measurement in pulse width/delay detector circuit 20 of FIG. 5 is performed by determining the location of edges of the selected clock signal at the output of logical-NAND gate NAND15 with respect to the phase of an externally-supplied stable reference clock ext clk. An inverter chain formed by inverters I20A, I21A, through I20N, I21N provides delayed versions of the selected clock signal under measurement to the inputs of a set of latches Q1-QN, via inverters I22A-I22N. Latches Q1-QN are clocked by external clock signal ext clk and the outputs of latches Q1-QN are provided as a measurement result to a test system via scan latches or another digital output interface. The pulse width of either local clock signal lclk or delayed clock signal dellclk is performed by adjusting the phase of external clock signal ext clk until the rising edge of the selected clock signal under measurement is detected by a logical "1" appearing at a particular one of latches Q1-QN. The phase of external clock signal ext clk is then adjusted until a logical "0" appears at the same particular one of latches Q1-QN. The phase of external clock signal ext clk is captured at both edge detections and the difference in the measured phases yields the pulse width of the selected clock under measurement. To determine the delay between local clock signal lclk and delayed clock signal dellclk, the same procedure can be followed with respect to the rising edge of local clock signal lclk and the rising edge of delayed clock signal dellclk. Each measurement is repeated a number of times (generally in the hundreds), so that jitter and noise do not influence the measurements. A number of measurements are taken for each selected clock signal under measurement at each edge being measured, before measuring the other edge/clock signal under measurement.

Figure 6A:
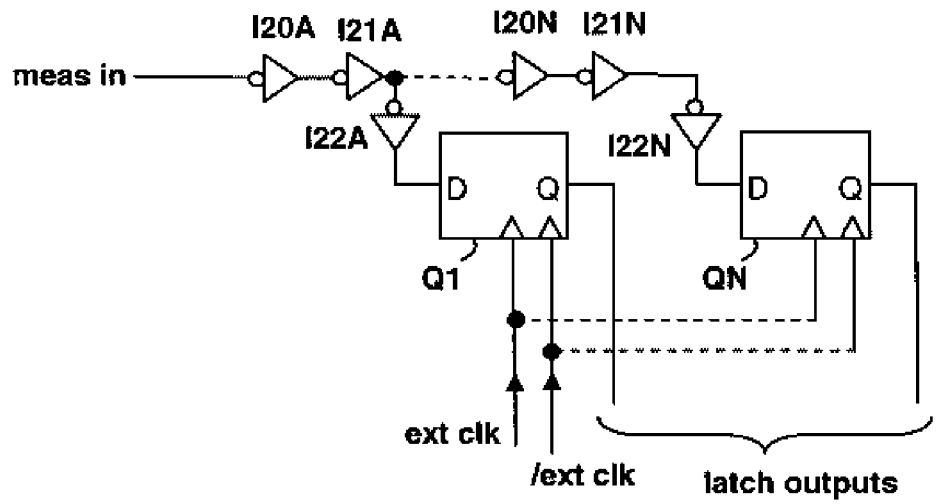
FIG. 6A is a schematic diagram depicting details of portions of pulse width/delay detector 20 of FIG. 5, in accordance with another embodiment of the invention.

Referring now to FIG. 6A, an alternative edge detector circuit that may be used in the pulse width/delay detector circuit 20 of FIG. 5 is shown in accordance with another embodiment of the present invention. In the circuit of FIG. 6A, a differential version of external clock signal ext clk is provided by including complementary external clock signal /ext clk and latches Q1-QN are triggered by both external clock signal ext clk and complementary external clock signal /ext clk. The circuit of FIG. 6A provides for elimination of error due to the set-up time difference for external clock signal ext clk for each edge with respect to latches Q1-QN, since both edges of external clock signal ext clk are involved in the measurement.

Figure 6B:
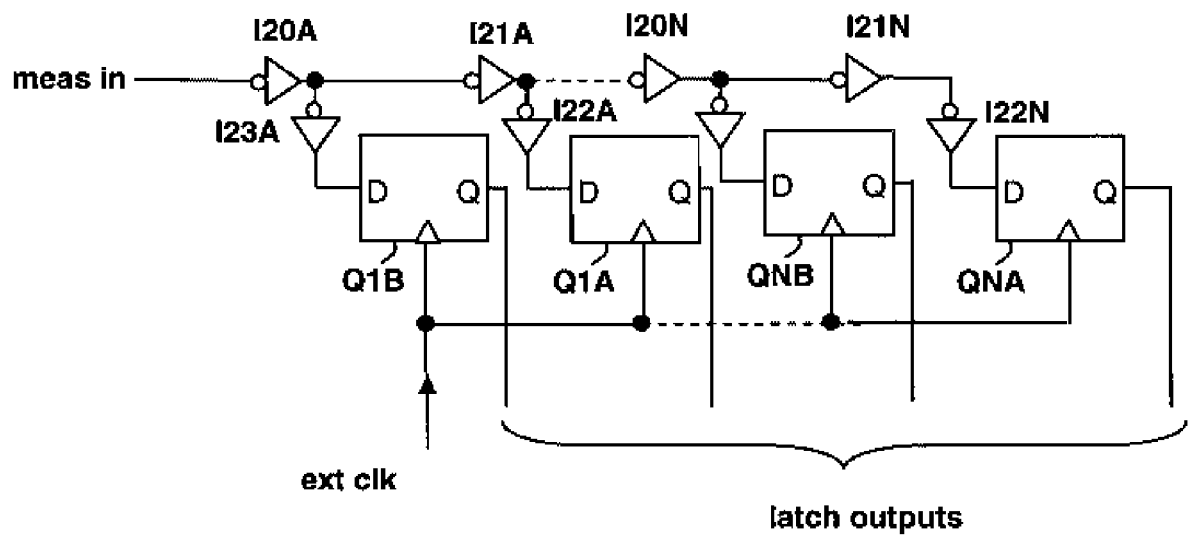
FIG. 6B is a schematic diagram depicting details of portions of pulse width/delay detector 20 of FIG. 5, in accordance with yet another embodiment of the invention.

Referring now to FIG. 6B, another alternative edge detector circuit that may be used in the pulse width/delay detector circuit 20 of FIG. 5 is shown in accordance with yet another embodiment of the present invention. In the circuit of FIG. 6B, latches Q1B-QNB capture edges of the inverted version of the clock signal under measurement provided from the outputs of inverters I20A-I20N by inverters I23A-I23N, while latches Q1A-QNA capture the same edge as latches Q1-QN in the embodiments described with reference to FIG. 5 and FIG. 6B. The circuit of FIG. 6B provides for measurement of both the non-inverted and inverted pulse width of the clock signal under measurement, eliminating any rising edge vs. falling edge skew error due to the pulse width measurement circuitry. The techniques of both FIG. 6A and FIG. 6B can be combined to further reduce error due to skew in both the measurement circuitry with respect to both the clock signal under measurement and external clock signal ext clk.

Figure 7:
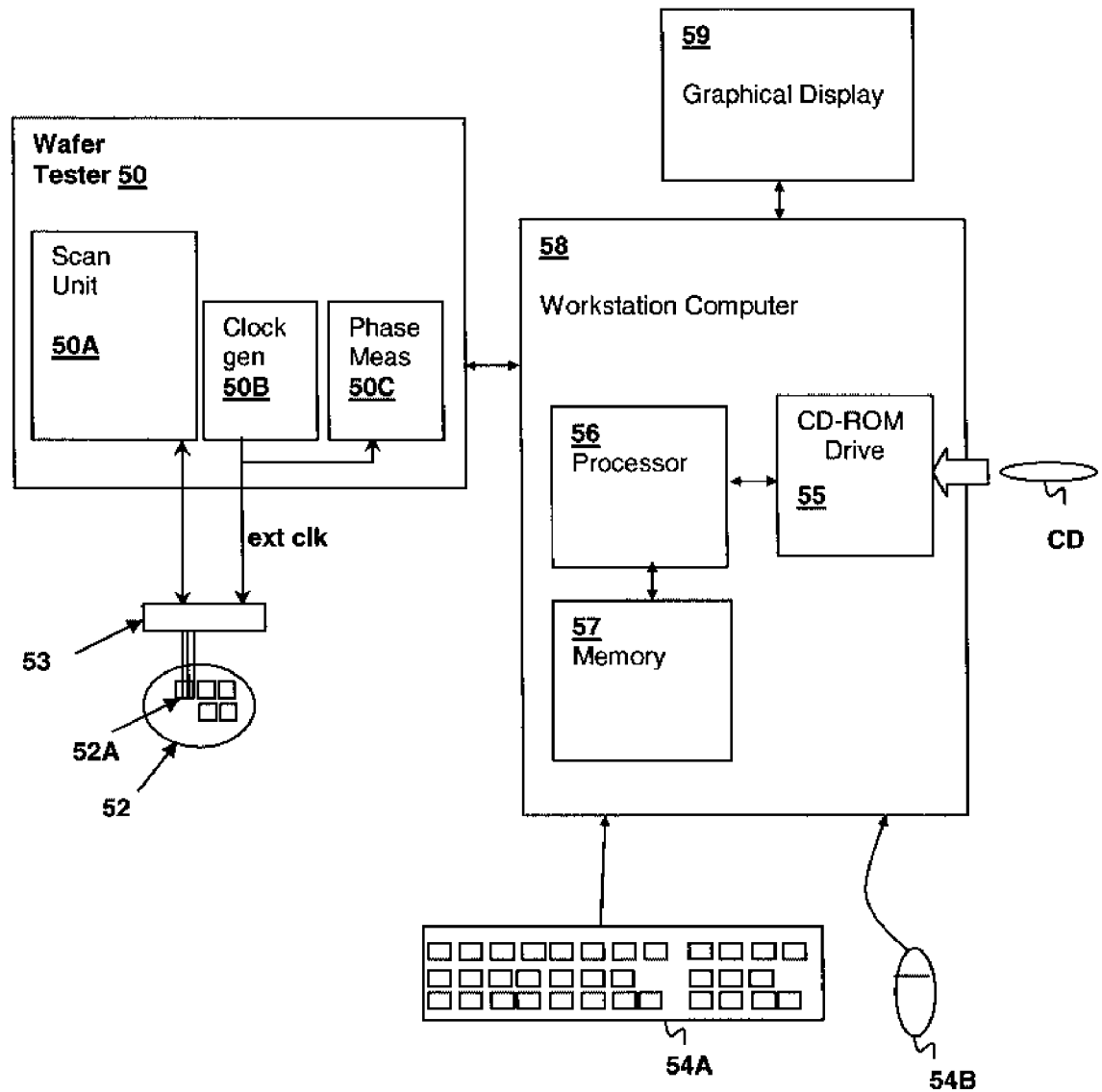
FIG. 7 is a wafer test system which may be used to practice a method according to an embodiment of the present invention.

Referring now to FIG. 7, a VLSI wafer test system, in which methods according to an embodiment of the present invention are performed, is depicted. A wafer tester 50 includes a boundary scan unit 50A for providing stimulus to and retrieving data from a die 52A on a wafer under test 52 via a probe head 53 having electrical test connections to die 52A. Wafer tester 50 includes a phase measurement unit 50C, that evaluates a phase of external clock signal generated by clock generator 50B and supplied to die 52A by probe head 53.

A workstation computer 58, having a processor 56 coupled to a memory 57, for executing program instructions from memory 57, wherein the program instructions include program instructions for receiving data from wafer tester 50 and/or circuits within wafer 52 in accordance with an embodiment of the present invention, is coupled to wafer tester 50. Generally the methods of the present invention operate scan unit 50A to set delays dl1-dl3 and select a particular clock and edge for measurement and access the storage array values with read and write operations. The methods also measure the phase of external clock signal ext clk with respect to occurrence of the selected edge of the selected clock signal under measurement. As an alternative to using phase measurement unit 50C, counters may be included within the die circuits to count the cycles of external clock signal ext clk, and the counter values read from scan chains via tester scan unit 50A. Program instructions obtain the counts from wafer tester 50 or read the counts from wafer 52, then process the counts to obtain the phase of external clock signal ext clk. The program instructions may be loaded from a storage media such as optical disc CD via a CD-ROM drive 55 or other suitable optical or magnetic/non-volatile memory drive. The data produced by embodiments of the present invention are collected from multiple tests of particular ones or all of storage cells 10 within dies 52A, and may be performed under varying temperature and power supply voltage conditions to completely characterize the timing margins within the storage array circuit. The results of all of the measurements can then be evaluated to either change the design of the array control llgic or storage cells 10, determine whether fabrication process has deviated exceedingly from tolerable norms or to determine operational ranges such as power supply voltage tolerances and access cycle times.

Data from delay/pulse width tests in accordance with embodiments of the invention are transferred to workstation computer 58 via wafer tester 50 and stored in memory 57 and/or other media storage such as a hard disk. Workstation computer 58 is also coupled to a graphical display 59 for displaying program output such as the measured edge phase and/or pulse width and delay results of the memory tests described above. Graphical display 59 may also display textual or graphical results showing timing margin resultant information and distributions of measured values. Workstation computer 58 is further coupled to input devices such as a mouse 54B and a keyboard 54A for receiving user input. Workstation computer 58 may be coupled to a public network such as the Internet, or may be a private network such as the various "intra-nets" and software containing program instructions for analyzing data produced by methods and circuits in accordance with embodiments of the present invention may be located on remote computers or locally within workstation computer 58. Further, workstation computer 58 may be coupled to wafer tester 50 by such a network connection.

While the system of FIG. 6 depicts a configuration suitable for sequential test of a plurality of dies on a wafer, the depicted system is illustrative and not limiting to the present invention. Probe head 53 may be a multi-die full wafer probe system, or may comprise multiple probe heads for simultaneously testing multiple wafers on a single or multiple die basis. Additionally, while scan chain data retrieval and stimulus is illustrated, the techniques of the present invention may also be applied to other interfaces available to probe wafer 52, or applied to circuits implemented in fully functional dies where data extraction is performed over a serial or parallel bus or other interface.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A storage circuit, comprising:
a plurality of identical storage cells forming an array having rows and columns, wherein the storage cells in the columns are connected by bitlines, wherein at least one bitline corresponding to each column is connected to a corresponding one of a plurality of column read circuits for providing a read output signal for each column, and each row has a corresponding wordline select input connected to the storage cells in a corresponding row;
a pre-charge circuit for pre-charging the bitlines in response to a de-asserted state of a local clock signal;
wordline control logic for activating the wordline select input of a selected row in response to an asserted state of the local clock signal; and
a programmable clock control logic for generating the local clock signal from a global clock signal and including at least one delay circuit having an adjustable delay, wherein a timing of the local clock signal is adjusted in conformity with at least one control value, whereby operational timing margins of the array of identical storage cells is adjustable.

2. The storage circuit of claim 1, wherein a first one of the at least one delay circuit adjusts a pulse width of the local clock signal in conformity with a first one of the at least one control value, whereby a read or write access timing margin is adjustable by adjusting the first control value.

3. The storage circuit of claim 2, further comprising a read circuit for receiving the bitlines as inputs and having an output for providing data output values read from the array, wherein the read circuit is responsive to an asserted state of a delayed local clock signal to evaluate states of the bitlines to determine the data output values, and is further responsive to a de-asserted state of the delayed local clock signal to latch the data output values, wherein the programmable clock control logic further generates the delayed local clock signal from the global clock signal, and wherein a second one of the at least one delay circuit adjusts a timing of the delayed local clock signal with respect to the local clock signal in conformity with a second one of the at least one control value, whereby a set-up timing margin of the read circuit is adjustable by adjusting the second control value.

4. The storage circuit of claim 3, wherein a third one of the at least one delay circuit adjusts a pulse width of the delayed local clock signal in conformity with to a third one of the at least one control value, whereby a read evaluation completion timing margin is adjustable by adjusting the third control value.

5. The storage circuit of claim 1, further comprising a read circuit for receiving the bitlines as inputs and having an output for providing data output values read from the array, wherein the read circuit is responsive to an asserted state of the local clock signal to evaluate states of the bitlines to determine the data output values, and is further responsive to a de-asserted state of the local clock signal to latch the data output values, and wherein a first one of the at least one delay circuit adjusts a timing of the local clock signal in conformity with a first one of the at least one control value, whereby a set-up timing margin of the read circuit is adjustable by adjusting the first control value.

6. The storage circuit of claim 1, further comprising a read circuit for receiving the bitlines as inputs and having an output for providing data output values read from the array, wherein the read circuit is responsive to an asserted state of the local clock signal to evaluate states of the bitlines to determine the data output values, and is further responsive to a de-asserted state of the local clock signal to latch the data output values, and wherein a first one of the at least one delay circuit adjusts a pulse width of the local clock signal in conformity with a first one of the at least one control value, whereby a read evaluation completion timing margin is adjustable by adjusting the first control value.

7. The storage circuit of claim 1, further comprising an edge detector for detecting an edge of the local clock signal, whereby a magnitude of the adjustable delay of the at least one delay circuit is measured with reference to the phase of an external clock signal provided to the edge detector.

8. The storage circuit of claim 7, wherein the edge detector comprises a plurality of cascaded latches having a data input coupled to the local clock signal and having clock inputs coupled to the stable reference clock signal.

9. The storage circuit of claim 1, wherein the at least one delay circuit has an analog control input for accepting an analog signal as the at least one control value.

10. The storage circuit of claim 9, further comprising at least one control voltage generator for accepting a digital input and generating the analog signal as an output, wherein an output of the at least one control voltage generator is coupled to the analog control input of the at least one delay circuit.

11. A method for measuring timing characteristics of a storage array, the method comprising:
providing at least one control value to the storage array;
adjusting at least one delay circuit within the storage array in conformity with the at least one control value, wherein the at least one delay circuit delays at least one edge of a local clock signal controlling storage cell read or write operations within the array; and
determining at least one timing margin of an event controlled by the at least one edge of the local clock signal by varying the at least one control value.

12. The method of claim 11, wherein the adjusting adjusts a pulse width of a local clock signal that controls access to storage cells within the storage array, whereby a read or write access timing margin is determined by varying the first control value.

13. The method of claim 12, wherein the adjusting further adjusts a timing of a delayed local clock signal that controls read evaluation within the storage array with respect to the local clock signal, in conformity with a second one of the at least one control value, whereby a set-up timing margin is determined by varying the second control value.

14. The method of claim 13, wherein the adjusting further adjusts a pulse width of the delayed local clock signal in conformity with a third one of the at least one control value, whereby a read evaluation completion timing margin is determined by varying the third control value.

15. The method of claim 11, wherein the adjusting adjusts a timing of a delayed local clock signal that controls read evaluation within the storage array with respect to the local clock signal in conformity with a first one of the at least one control value, whereby a set-up timing margin is determined by varying the second control value.

16. The method of claim 11, wherein the adjusting further adjusts a pulse width of a delayed local clock signal that controls read evaluation within the storage array in conformity with a first one of the at least one control value, whereby a read evaluation completion timing margin is determined by varying the first control value.

17. The method of claim 11, further comprising detecting an edge of the local clock signal, whereby a magnitude of the adjusting is measured with reference to the phase of an external clock signal provided to the storage array.

18. The method of claim 17, wherein the detecting is performed by latching the local clock signal with a plurality of cascaded latches having a data input coupled to the local clock signal and having clock inputs coupled to the stable reference clock signal.

19. The method of claim 11, wherein the adjusting is performed by adjusting an analog signal as the at least one control value.

20. The method of claim 19, further comprising generating the analog signal within the storage array from a digital control value provided to the storage array.

21. A storage circuit, comprising:
a plurality of identical storage cells forming an array having rows and columns, wherein the storage cells in the columns are connected by bitlines, wherein at least one bitline corresponding to each column is connected to a corresponding one of a plurality of column read circuits for providing a read output signal for each column, and each row has a corresponding wordline select input connected to the storage cells in a corresponding row;

a pre-charge circuit for pre-charging the bitlines in response to a de-asserted state of a local clock signal;

wordline control logic for activating the wordline select input of a selected row in response to an asserted state of the local clock signal;

a read circuit for receiving the bitlines as inputs and having an output for providing data output values read from the array, wherein the read circuit is responsive to an asserted state of a delayed local clock signal to evaluate states of the bitlines to determine the data output values, and is further responsive to a de-asserted state of the delayed local clock signal to latch the data output values;

a programmable clock control logic for generating the local clock signal and the delayed clock signal from a global clock signal and including a first delay circuit having an adjustable delay for adjusting a pulse width of the local clock signal in conformity with a first control value, a second delay circuit for adjusting a timing of the delayed local clock signal with respect to the local clock signal in conformity with a second control value, and a third delay circuit for adjusting a pulse width of the delayed local clock signal in conformity with a third control value, whereby a read or write access timing margin is adjustable by adjusting the first control value, whereby a set-up timing margin of the read circuit is adjustable by adjusting the second control value, and whereby a read evaluation completion timing margin is adjustable by adjusting the third control value; and an edge detector for detecting edges of the local clock signal and the delayed clock signal, whereby a magnitude of the adjustable delays of the first delay circuit, the second delay circuit and the third delay circuit are measured with reference to the phase of an external clock signal provided to the edge detector.

22. A method for measuring timing characteristics of a storage array, the method comprising:

providing a first control value, a second control value and a third control value to the storage array;

first adjusting a first delay circuit within the storage array in conformity with the first control value, wherein the first delay circuit controls a pulse width of a local clock signal controlling storage cell read or write operations within the array;

second adjusting a second delay circuit within the storage array in conformity with the second control value, wherein the second delay circuit controls a timing of a delayed local clock signal that controls read evaluation within the storage array with respect to the local clock signal;

third adjusting a third delay circuit within the storage array in conformity with the third control value, wherein the third delay circuit controls a pulse width of the delayed local clock signal;

determining a read or write access timing margin by varying the first control value;

determining a set-up timing margin by varying the second control value;

determining a read evaluation completion timing margin by varying the third control value;

detecting edges of the local clock signal and the delayed local clock signal, whereby a magnitude of the first, second and third adjusting are measured with reference to the phase of an external clock signal provided to the storage array.

23. A storage circuit, comprising:

a plurality of identical storage cells forming an array having rows and columns, wherein the storage cells in the columns are connected by bitlines, wherein at least one bitline corresponding to each column is connected to a corresponding one of a plurality of column read circuits for providing a read output signal for each column, and each row has a corresponding wordline select input connected to the storage cells in a corresponding row;

a pre-charge circuit for pre-charging the bitlines in response to a de-asserted state of a local clock signal;

wordline control logic for activating the wordline select input of a selected row in response to an asserted state of the local clock signal; and an edge detector for detecting an edge of the local clock signal, whereby timing of the local clock signal is measured with reference to the phase of an external clock signal provided to the edge detector.

24. The storage circuit of claim 23, wherein the edge detector comprises a plurality of cascaded latches having a data input coupled to the local clock signal and having clock inputs coupled to the stable reference clock signal.

25. The storage circuit of claim 23, wherein the edge detector comprises:

a first selector for selecting the local clock signal from among a plurality of local clock signal; and a second selector for selecting a polarity of the edge detected by the edge detector.

* * * * *